(12) United States Patent
Korevaar et al.

(10) Patent No.: US 8,816,190 B2
(45) Date of Patent: Aug. 26, 2014

(54) PHOTOVOLTAIC DEVICES AND METHOD OF MAKING

(75) Inventors: Bastiaan Arie Korevaar, Schenectady, NY (US); Renee Mary Whitney, Voorheesville, NY (US); Faisal Razi Ahmad, Niskayuna, NY (US)

(73) Assignee: First Solar, Inc., Tempe, AZ (US)

( * ) Notice: Subject to any disclaimer, the term of this patent is extended or adjusted under 35 U.S.C. 154(b) by 650 days.

(21) Appl. No.: 13/088,496

(22) Filed: Apr. 18, 2011

(65) Prior Publication Data

US 2012/0260978 A1  Oct. 18, 2012

(51) Int. Cl.
*H01L 31/073* (2012.01)
*H01L 31/0352* (2006.01)

(52) U.S. Cl.
CPC ........ *H01L 31/03529* (2013.01); *H01L 31/073* (2013.01); *Y02E 10/543* (2013.01)
USPC .......................................... 136/255; 136/260

(58) Field of Classification Search
CPC ........................ H01L 31/073; H01L 31/03529
USPC ................................................. 136/255, 260
See application file for complete search history.

(56) References Cited

U.S. PATENT DOCUMENTS

| | | | |
|---|---|---|---|
| 5,094,697 A * | 3/1992 | Takabayashi et al. ........ | 136/249 |
| 5,261,968 A * | 11/1993 | Jordan ........................... | 136/244 |
| 5,279,678 A * | 1/1994 | Jordan et al. .................. | 136/244 |
| 5,501,744 A | 3/1996 | Albright et al. | |
| 2006/0130891 A1* | 6/2006 | Carlson ......................... | 136/256 |
| 2009/0078318 A1 | 3/2009 | Meyers et al. | |
| 2009/0211637 A1 | 8/2009 | Eaglesham | |
| 2009/0223562 A1* | 9/2009 | Niira et al. ..................... | 136/256 |
| 2012/0192934 A1* | 8/2012 | Fan et al. ....................... | 136/255 |

OTHER PUBLICATIONS

Singh et al., "Nano-structured CdTe, CdS and TiO2 for thin film solar cell applications", Solar Energy Materials & Solar Cells, 2004, vol. 82, pp. 315-330.
Alvin D Compaan, "Materials Challenges for Terrestrial Thin-Film Photovoltaics", Journal of the Minerals, Metals and Materials Society, Dec. 2007, vol. 59, Issue 12, pp. 31-36.
Allsop et al., "Three-dimensional simulations of a thin film heterojunction solar cell with a point contact/defect passivation structure at the heterointerface", Applied Physics Letters, 2009, vol. 95, issue 12, 3 pages.

* cited by examiner

*Primary Examiner* — Jonathan Johnson
*Assistant Examiner* — Allison Bourke
(74) *Attorney, Agent, or Firm* — MacMillan, Sobanski & Todd, LLC (57) ABSTRACT

In one aspect of the present invention, a photovoltaic device is provided. The photovoltaic device includes a transparent layer; a first porous layer disposed on the transparent layer, wherein the first porous layer comprises a plurality of pores extending through a thickness of the first porous layer; a first semiconductor material disposed in the plurality of pores to form a patterned first semiconductor layer; and a second semiconductor layer disposed on the first porous layer and the patterned first semiconductor layer, wherein the patterned first semiconductor layer is substantially transparent. Method of making a photovoltaic device is also provided.

10 Claims, 8 Drawing Sheets

PHOTOVOLTAIC DEVICES AND METHOD OF MAKING

BACKGROUND

The invention generally relates to photovoltaic devices. More particularly, the invention relates to improved interfaces for photovoltaic devices.

Thin film solar cells or photovoltaic devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. Cadmium telluride/cadmium sulfide (CdTe/CdS) heterojunction-based photovoltaic cells are one such example of thin film solar cells.

Cadmium telluride (CdTe)-based photovoltaic devices typically demonstrate relatively low power conversion efficiencies, which may be attributed to a relatively low open circuit voltage ($V_{oc}$) in relation to the band gap of the material which is due, in part, to the low effective carrier concentration and short minority carrier lifetime in CdTe. There is also an increased drive for decreasing the thickness of the CdTe layer because of the low availability of tellurium and also increased interest in photovoltaic devices with "n-i-p" configuration. However, current CdTe devices may have significant recombination of electron-hole pairs at the front interface between CdS and CdTe. Furthermore, thinner CdTe may also lead to recombination of electron hole-hole pairs at the back contact of the CdTe photovoltaic device. Recombination of electron-hole pairs may lead to lower open circuit voltage and thus lower efficiencies.

Thus, minimizing the recombination of the electron/hole pairs at one or both the front interface and the back interface in thin film CdTe photovoltaic cells may be desirable. Thus, there is a need to provide improved photovoltaic device configurations having desired short circuit current ($J_{SC}$), open circuit voltage values ($V_{OC}$), fill factor (FF), and efficiency values.

BRIEF DESCRIPTION OF THE INVENTION

Embodiments of the present invention are provided to meet these and other needs. One embodiment is a photovoltaic device. The photovoltaic device includes a transparent layer; a first porous layer disposed on the transparent layer, wherein the first porous layer includes a plurality of pores extending through a thickness of the first porous layer; a first semiconductor material disposed in the plurality of pores to form a patterned first semiconductor layer; and a second semiconductor layer disposed on the first porous layer and the patterned first semiconductor layer, wherein the patterned first semiconductor layer is substantially transparent.

One embodiment is a method. The method includes disposing a transparent layer on a support; disposing a first porous layer on the transparent layer, wherein the first porous layer includes a plurality of pores extending through a thickness of the first porous layer; disposing a first semiconductor material in the plurality of pores to form a patterned first semiconductor layer; and disposing a second semiconductor layer on the first porous layer and the patterned first semiconductor layer, wherein the patterned first semiconductor layer is substantially transparent.

One embodiment is a photovoltaic device. The photovoltaic device includes a transparent layer; a first semiconductor layer disposed on the transparent layer; a second semiconductor layer disposed on the first semiconductor layer; a second porous layer disposed on the second semiconductor layer, wherein the second porous layer includes a plurality of pores extending through a thickness of the second porous layer; and a metal layer disposed on the second porous layer.

One embodiment is a method. The method includes disposing a transparent layer on a support; disposing a first semiconductor layer on the transparent layer; disposing a second semiconductor layer on the first semiconductor layer; disposing a second porous layer on the second semiconductor layer, wherein the second porous layer includes a plurality of pores extending through a thickness of the second porous layer; and disposing a metal layer on the second porous layer.

Another embodiment is a photovoltaic device. The photovoltaic device includes a transparent layer; a first porous layer disposed on the transparent layer, wherein the first porous layer includes a plurality of pores extending through a thickness of the first porous layer; a first semiconductor material disposed in the plurality of pores to form a patterned first semiconductor layer, wherein the patterned first semiconductor layer is substantially transparent; a second semiconductor layer disposed on the first porous layer and the patterned first semiconductor layer; a second porous layer disposed on the second semiconductor layer, wherein the second porous layer includes a plurality of pores extending through a thickness of the second porous layer; a p+-type semiconductor material disposed in the plurality of pores in the second porous layer to form a patterned p+-type semiconductor layer; and a metal layer disposed on the second porous layer and the patterned p+-type semiconductor layer.

DRAWINGS

These and other features, aspects, and advantages of the present invention will become better understood when the following detailed description is read with reference to the accompanying drawings, wherein.

DETAILED DESCRIPTION

As discussed in detail below, some of the embodiments of the invention provide improved interfaces in a photovoltaic device. In some embodiments, an improved front interface is provided. In certain exemplary embodiments, an improved front interface includes a porous layer disposed between a front TCO (transparent conductive oxide) layer and an absorber layer (for example, CdTe). The pores in the porous layer are filled with a window layer material (for example, CdS) to form a patterned window layer. Accordingly, in such embodiments, the patterned window layer includes discontinuous regions of window material that may function as point contacts for charge collection. In contrast to a continuous layer of window layer material in contact with the absorber layer, a patterned window layer may be advantageously used to minimize interface recombination, in accordance with one embodiment of the invention. Further, the reduced contact area between the window and absorber layers and the lower interface recombination may also result in lower leakage current density. A lower leakage current density may advantageously lead to an increase in open circuit voltage ($V_{OC}$) of the photovoltaic device. Furthermore, a thin patterned window layer may allow for more light to pass through to the absorber layer, which may lead to higher short circuit current density ($J_{SC}$).

In some other embodiments, an improved back interface is provided. In certain exemplary embodiments, an improved back interface includes a porous layer disposed between an absorber layer (for example, CdTe) and a back contact layer (for example, a metal), wherein the pores in the porous layer are filled with p+-type semiconductor material. Accordingly, in such embodiments, the patterned p+-type semiconductor layer includes discontinuous regions of p+-type material, thus reducing the contact area between the p+-type and back contact layers. The discontinuous regions of p+-type material may function as point contacts for charge collection and minimize interface recombination at the back contact. Further, a reduced contact area and lower interface recombination at the back contact may result in lower leakage current density. A lower leakage current density may advantageously lead to an increase in open circuit voltage ($V_{OC}$) of the photovoltaic device. In particular embodiments, photovoltaic device configurations with both improved front and back interfaces are provided.

Approximating language, as used herein throughout the specification and claims, may be applied to modify any quantitative representation that could permissibly vary without resulting in a change in the basic function to which it is related. Accordingly, a value modified by a term or terms, such as "about", is not limited to the precise value specified. In some instances, the approximating language may correspond to the precision of an instrument for measuring the value.

In the following specification and the claims, the singular forms "a", "an" and "the" include plural referents unless the context clearly dictates otherwise.

The terms "transparent region" and "transparent layer" as used herein, refer to a region or a layer that allows an average transmission of at least 80% of incident electromagnetic radiation having a wavelength in a range from about 300 nm to about 850 nm. As used herein, the term "disposed on" refers to layers disposed directly in contact with each other or indirectly by having intervening layers therebetween, unless otherwise specifically indicated.

Figure 1:
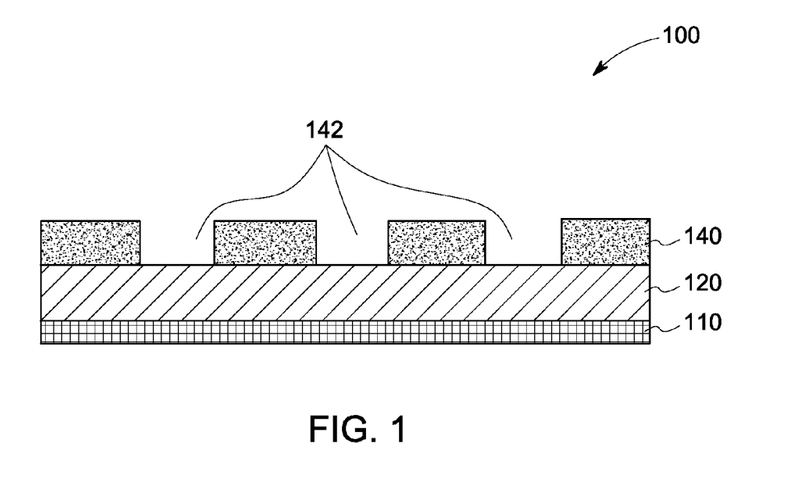
FIG. 1 is a schematic of a photovoltaic device, according to one embodiment of the invention.
Figure 2:
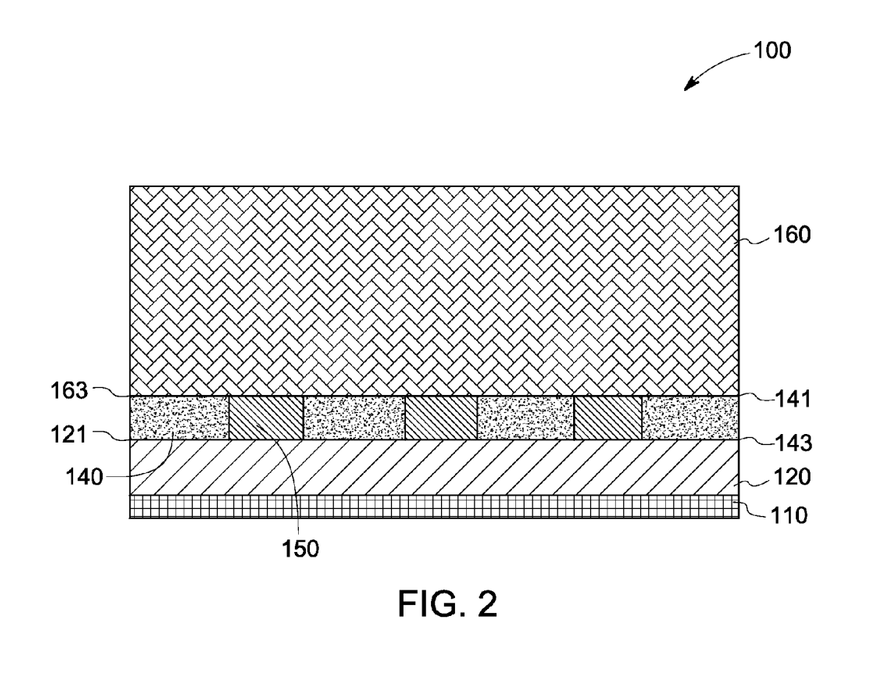
FIG. 2 is a schematic of a photovoltaic device, according to one embodiment of the invention.
Figure 3:
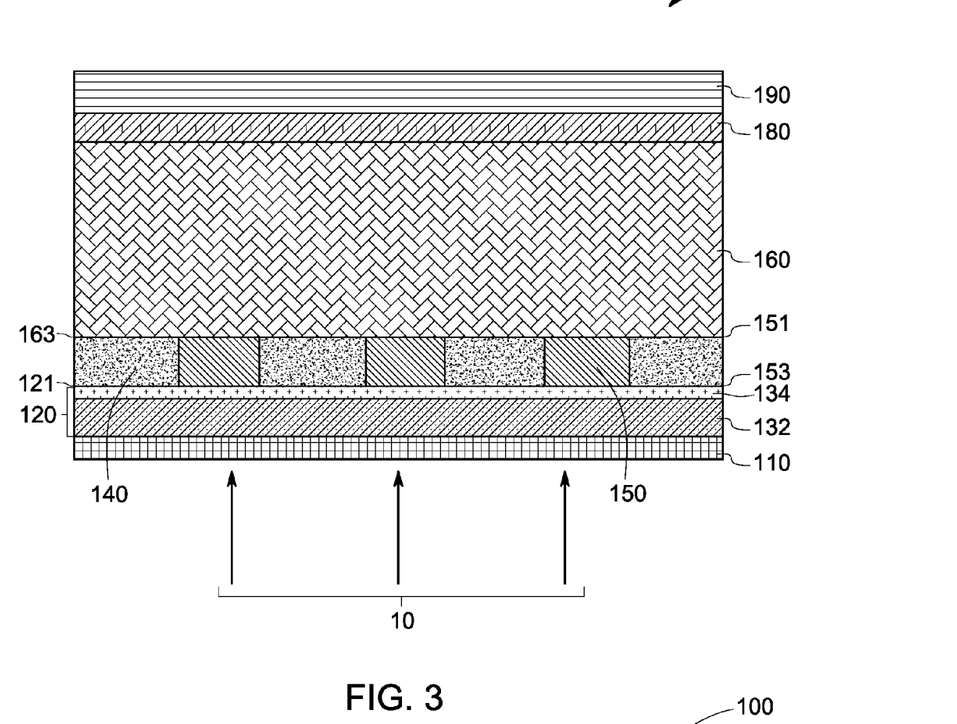
FIG. 3 is a schematic of a photovoltaic device, according to one embodiment of the invention.

As discussed in detail below, some embodiments of the invention are directed to improved interfaces in a photovoltaic device. In one embodiment, a photovoltaic device having an improved front interface is provided. "Front interface", as used herein, refers to the interface between a first semiconductor layer (for example, CdS) and a second semiconductor layer (for example, CdTe). A photovoltaic device 100, according to one embodiment of the invention, is illustrated in FIGS. 1-3. As shown in FIGS. 1-3, the photovoltaic device 100 includes a transparent layer 120 and a first porous layer 140 disposed on the transparent layer 120. In one embodiment, the transparent layer 120 is disposed on a support 110. Further, as indicated in FIG. 1, the first porous layer 140 includes a plurality of pores 142 extending through a thickness of the first porous layer 140. In one embodiment, as indicated in FIG. 2, a first semiconductor material is disposed in the plurality of pores 142 to form a patterned first semiconductor layer 150. In one embodiment, the photovoltaic device 100 further includes a second semiconductor layer 160 disposed on the first porous layer 140 and the patterned first semiconductor layer 150, as indicated in FIG. 2.

The patterned first semiconductor layer 150 is substantially transparent. As noted earlier, substantially transparent means that the patterned first semiconductor layer 150 allows an average transmission of at least 80% of incident electromagnetic radiation having a wavelength in a range from about 300 nm to about 850 nm to the second semiconductor layer 160.

In some embodiments, the patterned first semiconductor layer 150 and the second semiconductor layer 160 may be doped with a p-type dopant or an n-type dopant to form a heterojunction. As used in this context, a heterojunction is a semiconductor junction that is composed of layers of dissimilar semiconductor material. These materials usually have non-equal band gaps. As an example, a heterojunction can be formed by contact between a layer or region of one conductivity type with a layer or region of opposite conductivity, e.g., a "p-n" junction. In some embodiments, a combination of the porous layer 140, the patterned first semiconductor layer 150, and the second semiconductor layer 160 may advantageously provide for an improved front interface in the photovoltaic device 100.

As indicated in FIGS. 1-3, the transparent layer 120 is further disposed on a support 110. As illustrated in FIG. 3, in such embodiments, the solar radiation 10 enters from the support 110, and after passing through the transparent layer 120, the first porous layer 140, and the patterned first semiconductor layer 150, enters the second semiconducting layer 160, where the conversion of electromagnetic energy of incident light (for instance, sunlight) to electron-hole pairs (that is, to free electrical charge) occurs.

In one embodiment, the support 110 is transparent over the range of wavelengths for which transmission through the support 110 is desired. In one embodiment, the support 110 may be transparent to visible light having a wavelength in a range from about 400 nm to about 1000 nm. In some embodiments, the support 110 includes a material capable of withstanding heat treatment temperatures greater than about 600° C., such as, for example, silica or borosilicate glass. In some other embodiments, the support 110 includes a material that has a softening temperature lower than 600° C., such as, for example, soda-lime glass or a polyimide. In some embodiments certain other layers may be disposed between the transparent layer 120 and the support 110, such as, for example, an anti-reflective layer or a barrier layer (not shown).

In one embodiment, the transparent layer 120 includes an electrically conductive layer (or a front contact layer) 132 disposed on the support 110. In some embodiments, the first porous layer 140 is disposed directly on the electrically conductive layer 132. In an alternate embodiment, the transparent layer 120 includes an electrically conductive layer 132 disposed on the support 110 and an additional buffer layer 134 is interposed between the electrically conductive layer 132 and the patterned first semiconductor layer 150, as indicated in FIG. 3. In such embodiments, the first porous layer 140 may be disposed on the buffer layer 134. In one embodiment, the transparent layer 120 has a thickness in a range from about 100 nanometers to about 600 nanometers.

In one embodiment, the electrically conductive layer 132 includes a transparent conductive oxide (TCO). Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), and doped zinc oxide (ZnO), such as aluminum-doped zinc-oxide (ZnO:Al or AZO), indium-zinc oxide (IZO), and zinc tin oxide ($ZnSnO_x$), or combinations thereof. Depending on the specific TCO employed and on its sheet resistance, the thickness of the electrically conductive layer 132 may be in a range of from about 50 nm to about 600 nm, in one embodiment.

In some embodiments, as noted earlier, the photovoltaic device 100 further includes a buffer layer (optional), also called a higher resistance transparent (HRT) layer 134, interposed between the first porous layer 140 and the electrically conductive layer 132, as indicated in FIG. 3. In one embodiment, the thickness of the buffer layer 134 is in a range from about 50 nm to about 200 nm. Non-limiting examples of suitable materials for the buffer layer 134 include tin dioxide ($SnO_2$), zinc tin oxide (ZTO), zinc-doped tin oxide ($SnO_2$:Zn), zinc oxide (ZnO), indium oxide ($In_2O_3$), or combinations thereof.

In some other embodiments, the buffer layer 134 may be disposed within the pores of the first porous layer 130 and the first semiconductor material may be disposed on the buffer layer 134 within the pores of the first porous layer 140 (not shown). In such embodiments, the transparent layer 120 includes an electrically conductive layer 132 and the first porous layer 140 is disposed on the electrically conductive layer 134.

As noted earlier, the photovoltaic device 100 includes a first porous layer 140 having a plurality of pores 142 extending through a thickness of the first porous layer, as illustrated in FIG. 1. In one embodiment, the first porous layer 140 is substantially transparent. In one embodiment, the first porous layer 140 includes an insulating material. In one embodiment, the first porous layer 140 includes a material having passivation properties for the second semiconductor material, that is, a material that does not allow for electron-hole recombination at the interface between the first porous layer 140 and the second semiconductor layer 160. In some embodiments, the first porous layer 140 or the passivation layer has a surface/interface recombination velocity less than about $1 \times 10^5$ cm/s. In one embodiment, the first porous layer 140 includes a material having passivation properties for cadmium telluride. In one embodiment, the first porous layer 140 includes a material selected from the group consisting of silicon oxide, titanium oxide, silicon nitride, and combinations thereof.

Further, as illustrated in FIG. 2, the first porous layer 140 has a first surface 141 in contact with a second surface 163 of the second semiconductor layer 160. Furthermore, the first porous layer 140 has a second surface 143 in contact with a first surface 121 of the transparent layer 120. In some embodiments, the first surface 141 of the first porous layer 140 is disposed contiguous to the second surface 163 of the second semiconductor layer 160. Further, the second surface 143 of the first porous layer 140 is disposed contiguous to the first surface 121 of the transparent layer 120. In one embodiment, the first porous layer 140 is disposed on the transparent layer 120 such that there are no intervening layers between the first porous layer 140 and the transparent layer 120.

Without being bound by any theory, it is believed that the distance between the pores and the size of the pores in the first porous layer 140 may be optimized for charge collection, which may depend on local field strength, current crowding, and diffusion length of charge carriers in CdTe. In one embodiment, the plurality of pores 142 have an average diameter in a range less than about 1000 nanometers. In another embodiment, the plurality of pores 142 have an average diameter in a range less than about 500 nanometers. In yet another embodiment, the plurality of pores 142 have an average diameter in a range less than about 100 nanometers. In a particular embodiment, the plurality of pores 142 have an average diameter in a range from about 100 nanometers to about 1000 nanometers.

In one embodiment, the average distance between the pores is in a range less than about 1000 nanometers. In another embodiment, the average distance between the pores is in a range less than about 500 nanometers. In yet another embodiment, the average distance between the pores is in a range less than about 100 nanometers. In a particular embodiment, the average distance between the pores is in a range from about 100 nanometers to about 1000 nanometers.

The thickness of the first porous layer may be determined by the desired depth of the plurality of pores 142 and also the desired thickness of the patterned first semiconductor layer 150. In one embodiment, the first porous layer has a thickness in a range from about 25 nanometers to about 250 nanometers. In another embodiment, the first porous layer has a thickness in a range from about 50 nanometers to about 200 nanometers. In a particular embodiment, the first porous layer has a thickness in a range from about 50 nanometers to about 100 nanometers.

In one embodiment, the plurality of pores 142 have a circular shape with vertical sidewalls, as illustrated in FIG. 1. The shape of pores 142 is not limited, however, and the pores may include any suitable shape. For example, pores 142 may have an oval shape or a square shape with rounded corners, or another more complex shape. In another embodiment, the plurality of pores 142 may have tapered sidewalls.

Figure 5:
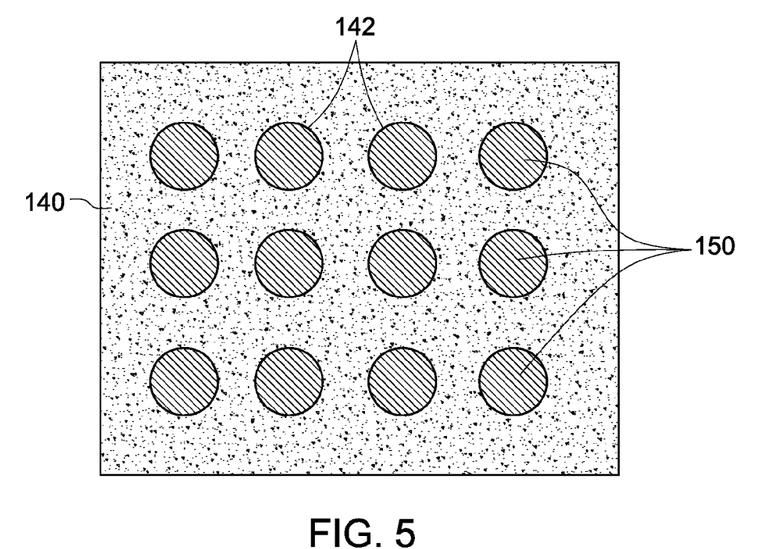
FIG. 5 is a schematic of a photovoltaic device, according to one embodiment of the invention.

As noted earlier, a first semiconductor material is disposed in the plurality of pores 142 of the first porous layer 140 to form a patterned first semiconductor layer 150, as indicated in FIGS. 2 and 3. FIG. 5 further illustrates a top-view of the first porous layer 140 and the patterned first semiconductor layer 150, according to an exemplary embodiment of the invention. As illustrated in FIG. 5, the first porous layer 140 includes a plurality of pores 142 and a first semiconductor material is disposed in the plurality of pores 142. The term "patterned first semiconductor layer" as used herein refers to a plurality of discontinuous regions 150 of first semiconductor material disposed within the plurality of pores 142 of the first porous layer 140, as indicated in FIG. 5. It should be further noted, that the term "patterned" should not be construed to limit the layer to any particular configuration (random versus non-random, for instance) or method of producing.

In FIG. 5, the plurality of discontinuous regions 150 are indicated as circular in shape and of uniform shape and size. However, in some other embodiments, the patterned semiconductor layer 150 may include a plurality of discontinuous regions, wherein the regions may be of different shape or size. Thus, by way of example, in some embodiments, the patterned semiconductor layer 150 may include a plurality of patterned regions such that a cross-sectional area of the plurality of regions may vary from region to region. In some other embodiments, the patterned semiconductor layer 150 may include a plurality of patterned regions having a substantially same cross-sectional area. In one embodiment, the patterned first semiconductor layer 150 may include a plurality of discontinuous regions having a circular shape, as illustrated in FIG. 5. The shape of the regions is not limited, however, and the regions may include any suitable shape. For example, regions 150 may have an oval shape or a square shape with rounded corners, or another more complex shape. In one embodiment, the shape and average size of the regions in the patterned first semiconductor layer may be determined by the shape and size of the plurality of pores in the first porous layer, the deposition method, or both.

In some embodiments, the plurality of patterned regions 150 may be further characterized by the aspect ratio defined herein as the ratio of thickness to the average diameter. In one embodiment, the plurality of patterned regions 150 have an aspect ratio less than about 1.5. In another embodiment, the plurality of patterned regions 150 have an aspect ratio less than about 1.0. In another embodiment, the plurality of patterned regions have an aspect ratio less than about 0.5. In yet another embodiment, the plurality of patterned regions 150 have an aspect ratio less than about 0.05.

In one embodiment, the first semiconductor material is disposed in the plurality of pores 142 such that the first semiconductor material is in contact with the transparent layer 140. The patterned first semiconductor layer 150 has a first surface 151 and second surface 153, as indicated in FIG. 3. In one embodiment, a second surface 153 of the patterned first semiconductor layer 150 is in contact with a first surface 121 of the transparent layer 120. In some embodiments, the first semiconductor material is disposed in the plurality of pores 142 such that the first semiconductor material is in contact with the electrically conductive layer 132. In some other embodiments, wherein an optional buffer layer 134 is used, the first semiconductor material is disposed in the plurality of pores such that the first semiconductor material is in contact with the buffer layer 134.

In one embodiment, the first semiconductor material fills the pores of the first porous layer 140. In one embodiment, a thickness of the patterned semiconductor layer 150 may be advantageously controlled such that the first semiconductor material is only disposed inside the plurality of pores 142. In one embodiment, the first semiconductor material is disposed within the plurality of pores 142 such that the patterned first semiconductor layer 150 does not extend outside the pores.

In one embodiment, the first semiconductor material is disposed in the plurality of pores 142 to form a patterned first semiconductor layer 150 having a thickness lower than or substantially the same as the thickness of the first porous layer 140. In contrast to a first semiconductor layer, wherein the first semiconductor material is a continuous film and a first porous layer 140 is not present, the patterned first semiconductor layer 150 of the present invention advantageously allows for more solar radiation to pass through it. Further, in contrast to a first semiconductor layer, wherein the first semiconductor material is disposed in the plurality of pores 142 and also extends outside the pores of the first porous layer 140, the patterned first semiconductor layer 150 of the present invention advantageously allows for more solar radiation to pass through it. Without being bound by any theory it is believed that reduced thickness of the patterned first semiconductor layer 150 may allow for more solar radiation to pass through and higher $J_{SC}$ in the photovoltaic device 100. In one embodiment, the patterned first semiconductor layer 150 has a thickness in a range from about 30 nm to about 150 nm.

Further, in one embodiment, an average diameter of the plurality of pores 142 is greater than a thickness of the patterned first semiconductor layer 150. In some embodiments, the plurality of pores 142 may be further characterized by the aspect ratio defined herein as the ratio of thickness to the average diameter. In one embodiment, the plurality of pores 142 have an aspect ratio less than about 1.5. In another embodiment, the plurality of pores 142 have an aspect ratio less than about 1.0. In another embodiment, the plurality of pores 142 have an aspect ratio less than about 0.5. In yet another embodiment, the plurality of pores 142 have an aspect ratio less than about 0.05.

Referring again to FIG. 3, in one embodiment, the patterned first semiconductor layer 150 has a second surface 153 such that the second surface 153 is in contact with a first surface 161 of the second semiconductor layer 160. Accordingly, the substantially transparent, patterned first semiconductor layer 150 allows for solar radiation to pass through to the second semiconductor layer 160 from the transparent layer 120 and further provides an electrical contact. In some embodiments, the patterned first semiconductor layer 150 may function as a window layer, as indicated in FIG. 3. Namely, the patterned first semiconductor layer or the window layer 150 is the junction-forming layer for the photovoltaic device 100 for the configurations shown in FIGS. 2 and 3.

In some embodiments, the discontinuous regions 150 in the patterned first semiconductor layer 150 may function as point contacts for charge collection. In one embodiment, in contrast to a continuous layer of first semiconductor material in contact with the second semiconductor layer 160, a discontinuous patterned first semiconductor layer 150 may be advantageously used to minimize interface recombination at the interface between the first 150 and second 160 semiconductor layers, in accordance with one embodiment of the invention. Without being bound by any theory, it is further believed that a total area over which a leakage current occurs may be reduced as the contact area between the first and semiconducting layers decreases, as indicated in FIGS. 2 and 3. Lower interface recombination and reduced contact area may lead to lower leakage current density. A lower leakage current density may advantageously lead to an increase in open circuit voltage ($V_{OC}$) of the photovoltaic device 100.

In some embodiments, the first semiconductor material includes an n-type semiconductor material. In such embodiments, the second semiconductor layer 160 may be doped to be p-type and the patterned first semiconductor layer 150 and the second semiconductor layer 160 may form an "n-p" heterojunction. Non-limiting exemplary materials for the first semiconductor material include cadmium sulfide (CdS), indium III sulfide ($In_2S_3$), zinc sulfide (ZnS), zinc telluride (ZnTe), zinc selenide (ZnSe), cadmium selenide (CdSe), oxygenated cadmium sulfide (CdS:0), copper oxide ($Cu_2O$), zinc oxihydrate (ZnO,H), and combinations thereof. In a particular embodiment, the first semiconductor material includes CdS.

In one embodiment, a patterned first semiconductor layer 150 may be compositionally graded across the thickness of the first semiconductor layer 150. The term "compositionally graded", as used herein, means that the composition of the patterned first semiconductor layer 150 may vary from the first surface 151 (in contact with the transparent layer) to the second surface 153 (in contact with the second semiconductor layer). In one embodiment, the material composition of the patterned first semiconductor layer 150 may vary continuously across the thickness of the patterned first semiconductor layer 150.

Figure 4:
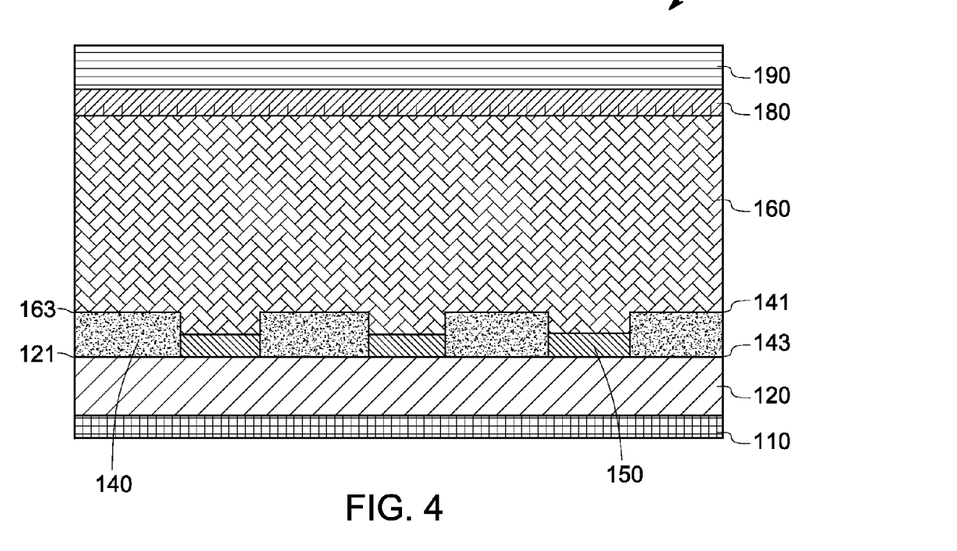
FIG. 4 is a schematic of a photovoltaic device, according to one embodiment of the invention.

In another embodiment, a portion of the second semiconductor layer 160 may be further disposed in the plurality of pores 142 to form a contact with the patterned first semiconductor layer 150, as indicated in FIG. 4. In such embodiments, a first semiconductor material and a second semiconductor material may together fill the pores of the first porous layer 140. In one embodiment, a first semiconductor material may be disposed in the plurality of pores 142 of the first porous layer 140 to a predetermined thickness and subsequently the second semiconductor material may be disposed on top of the first semiconductor material. In certain embodiments, the composition of the first semiconductor material and the second semiconductor material may vary continuously at the interface between the first and second semiconductor layers for the configuration shown in FIG. 4. As noted earlier, a thinner patterned first semiconductor layer 150 may allow for more light to pass through to the second semiconductor layer 160, which may lead to higher $J_{SC}$.

In some embodiments, the second semiconductor layer 160 includes an absorber layer. Typically, when solar radiation 10 is incident on the photovoltaic device 100, electrons in the absorber layer 160 are excited from a lower energy "ground state," in which they are bound to specific atoms in the solid, to a higher "excited state," in which they can move through the solid.

In one embodiment, the second semiconductor layer 160 includes a p-type semiconductor material. In one embodiment, the second semiconductor layer 160 has a carrier density in a range from about $1\times10^{13}$ per cubic centimeter to about $1\times10^{16}$ per cubic centimeter. As used herein, the term "carrier density" refers to the concentration of holes and electrons in a material. In such instances, the patterned first semiconducting layer 150 may be doped to be n-type, and the second semiconductor layer 160 and the patterned first semiconductor layer 150 may form a "p-n" or "n-p" junction, as mentioned above.

In one embodiment, a photoactive material is used for forming the second semiconducting layer 160. Suitable photo-active materials include cadmium telluride (CdTe), cadmium zinc telluride (CdZnTe), cadmium magnesium telluride (CdMgTe), cadmium manganese telluride (CdMnTe), cadmium sulfur telluride (CdSTe), zinc telluride (ZnTe), copper indium sulphide (CIS), copper indium gallium selenide (CIGS), copper zinc tin sulphide (CZTS), and combinations thereof. The above-mentioned photo-active semiconductor materials may be used alone or in combination. Further, these materials may be present in more than one layer, each layer having different type of photo-active material or having combinations of the materials in separate layers. In one particular embodiment, the second semiconductor layer 160 includes cadmium telluride (CdTe). In one particular embodiment, the second semiconductor layer 160 includes p-type cadmium telluride (CdTe).

In one embodiment, the second semiconductor layer 160 has a thickness in a range from about 1000 nm to about 3000 nm. In a particular embodiment, the second semiconductor layer 160 has a thickness in a range from about 1500 nm to about 2000 nm. As noted earlier, the use of the first porous layer 140 and the patterned first semiconductor layer 150, according to some embodiments of the invention, advantageously provides for an improved interface between CdS and CdTe, providing a low recombining front interface for photovoltaic devices employing thin CdTe layers, such as, for example having a thickness in a range less than about 2 microns.

In one embodiment, the photovoltaic device 100 further includes a p+-type semiconductor layer 180 disposed on the second semiconductor layer 160, as indicated in FIG. 3. The term "p+-type semiconductor layer" as used herein refers to a semiconductor layer having an excess mobile p-type carrier or hole density compared to the p-type charge carrier or hole density in the second semiconductor layer 160. In one embodiment, the p+-type semiconductor layer has a p-type carrier density in a range greater than about $1\times10^{17}$ per cubic centimeter. In another embodiment, the p+-type semiconductor layer has a p-type carrier density in a range greater than about $5\times10^{17}$ per cubic centimeter. In yet another embodiment, the p+-type semiconductor layer has a p-type carrier density in a range greater than about $10^{18}$ per cubic centimeter. In a particular embodiment, the p+-type semiconductor layer has a p-type carrier density in a range from about $10^{17}$ per cubic centimeter to about $10^{20}$ per cubic centimeter.

The p+-type semiconductor layer 180 may be used as an interface between the second semiconductor layer 160 and the metal layer or the back contact layer 190, in some embodiments. Higher carrier densities of the p+-type semiconductor layer 180 may minimize the series resistance of the back contact layer, in comparison to other resistances within the device. In one embodiment, the p+-type semiconductor layer 180 has a thickness in a range from about 50 nm to about 200 nm.

In one embodiment, the p+-type semiconductor layer 180 includes a heavily doped p-type material selected from the group consisting of amorphous Si:H, amorphous SiC:H, crystalline Si, microcrystalline Si:H, microcrystalline SiGe:H, amorphous SiGe:H, amorphous Ge, microcrystalline Ge, GaAs, BaCuSF, BaCuSeF, BaCuTeF, LaCuOS, LaCuOSe, LaCuOTe, LaSrCuOS, $LaCuOSe_{0.6}Te_{0.4}$, BiCuOSe, BiCaCuOSe, PrCuOSe, NdCuOS, $Sr_2Cu_2ZnO_2S_2$, $Sr_2CuGaO_3S$, and combinations thereof.

In another embodiment, the p+-type semiconductor layer 180 includes a heavily doped p+-doped material selected from the group consisting of zinc telluride, magnesium telluride, manganese telluride, beryllium telluride, mercury telluride, arsenic telluride, antimony telluride, copper telluride, and combinations thereof. In some embodiments, the p+-doped material further includes a dopant selected from the group consisting of copper, gold, nitrogen, phosphorus, antimony, arsenic, silver, bismuth, sulfur, sodium, and combinations thereof.

In one embodiment, the photovoltaic device 100 further includes a metal layer, also called a back contact layer 190. In some embodiments, the metal layer 190 is disposed directly on the second semiconductor layer 160 (not shown). In some other embodiments, the metal layer 190 is disposed on the p+-type semiconductor layer 180 disposed on the second semiconductor layer 160, as indicated in FIG. 3. In some embodiments, the p+-type semiconductor layer 180 may provide for improved diffusion properties between the metal layer 190 and the second semiconductor layer 180. Accordingly, in some embodiments, any suitable metal having the desired conductivity and reflectivity may be selected as the back contact layer 190. In one embodiment, the metal layer 190 includes gold, platinum, molybdenum, tungsten, tantalum, palladium, aluminum, chromium, nickel, or silver. In certain embodiments, another metal layer (not shown), for example, aluminum, may be disposed on the metal layer 190 to provide lateral conduction to the outside circuit.

In one embodiment, a photovoltaic device having an improved "back interface" is provided. "Back interface", as used herein, refers to the interface between the second semiconductor layer (for example, CdTe) and the back contact layer.

Figure 6:
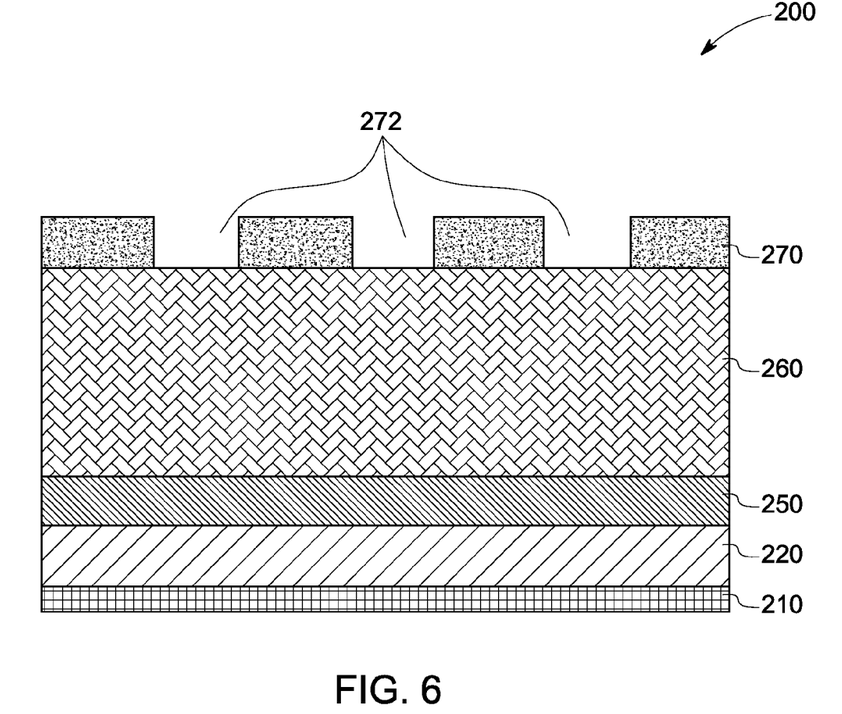
FIG. 6 is a schematic of a photovoltaic device, according to one embodiment of the invention.

A photovoltaic device 200 having an improved back interface, according to one embodiment of the invention, is illustrated in FIGS. 6-10. As shown in FIGS. 6-10, the photovoltaic device 200 includes a transparent layer 220 and a first semiconductor layer 250 disposed on the transparent layer 220. In one embodiment, the transparent layer 220 is disposed on a support 210. Further, as indicated in FIG. 6, a second semiconductor layer 260 is disposed on the first semiconductor layer 250. A second porous layer 270 is disposed on the second semiconductor layer 260, wherein the second porous layer 270 includes a plurality of pores 272 extending through a thickness of the second porous layer 270, as indicated in FIG. 6. In one embodiment, a metal layer 290 is disposed on the second porous layer.

Figure 7:
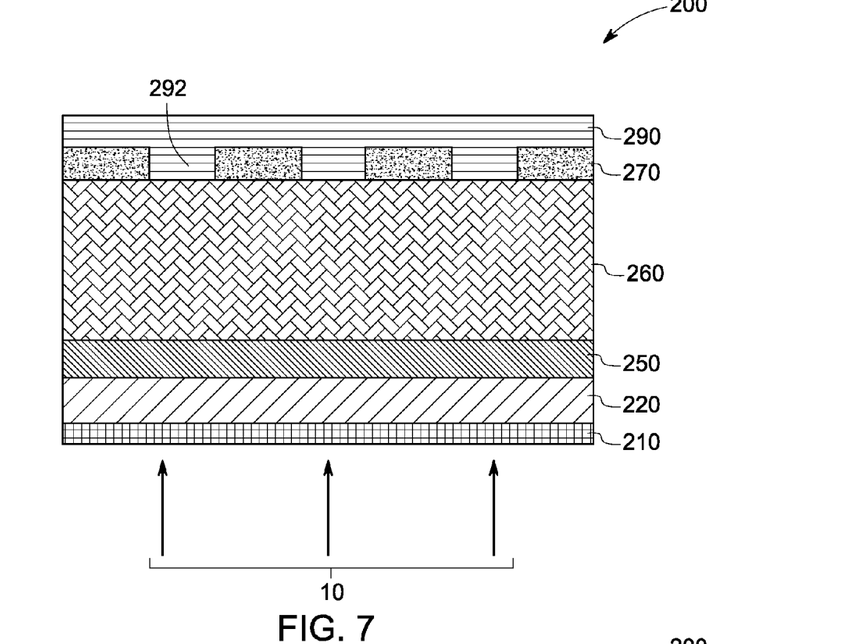
FIG. 7 is a schematic of a photovoltaic device, according to one embodiment of the invention.

In one embodiment, a metal layer 290 is disposed on the second porous layer 270, wherein a portion of the metal layer 292 extends through the plurality of pores 272 in the second porous layer 270 to contact the second semiconductor layer 260, as indicated in FIG. 7. Further, as illustrated in FIG. 7, selected portions 292 of the metal layer 290 are in contact with the second semiconductor layer 260. In such embodiments, the second porous layer 270 and the metal layer 290 may provide for an improved back interface in the photovoltaic device 200.

Figure 8:
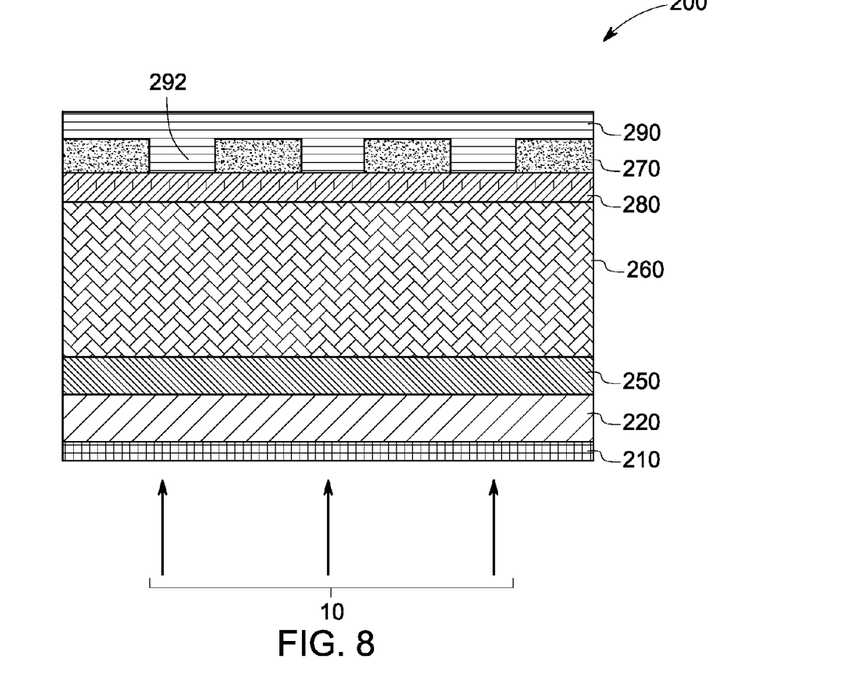
FIG. 8 is a schematic of a photovoltaic device, according to one embodiment of the invention.

In another embodiment, a p+-type semiconductor layer 280 is interposed between the second semiconductor layer 260 and the second porous layer 270, as indicated in FIG. 8. Further, in some embodiments, a metal layer 290 is disposed on the second porous layer 270, wherein a portion of the metal layer 292 extends through the plurality of pores 272 in the second porous layer 270 to contact the p+-type semiconductor layer 280, as illustrated in FIG. 8. In such embodiments, the second porous layer 270, the p+-type semiconductor layer 280, and the metal layer 290 may provide for an improved back interface in the photovoltaic device 200.

As illustrated in FIG. 8, selected portions 292 of the metal layer 290 are in contact with the p+-type semiconductor layer 280. In some embodiments, the portions of the metal layer 292 in contact with the p+-type semiconductor layer 280 may function as point contact for charge collection. In one embodiment, in contrast to a continuous layer of metal in contact with the p+-type semiconductor layer, a discontinuous metal layer 290 may be advantageously used to minimize interface recombination at the back interface, in accordance with one embodiment of the invention. Without being bound by any theory, it is believed that a total area over which a leakage current happens at the interface may be reduced as the contact area between the second semiconductor layer and back-contact layer decreases, as indicated in FIG. 8. Lower interface recombination and reduced contact area may lead to lower leakage current density over the whole area. A lower leakage current density may advantageously lead to an increase in open circuit voltage ($V_{OC}$) of the photovoltaic device 200.

Figure 9:
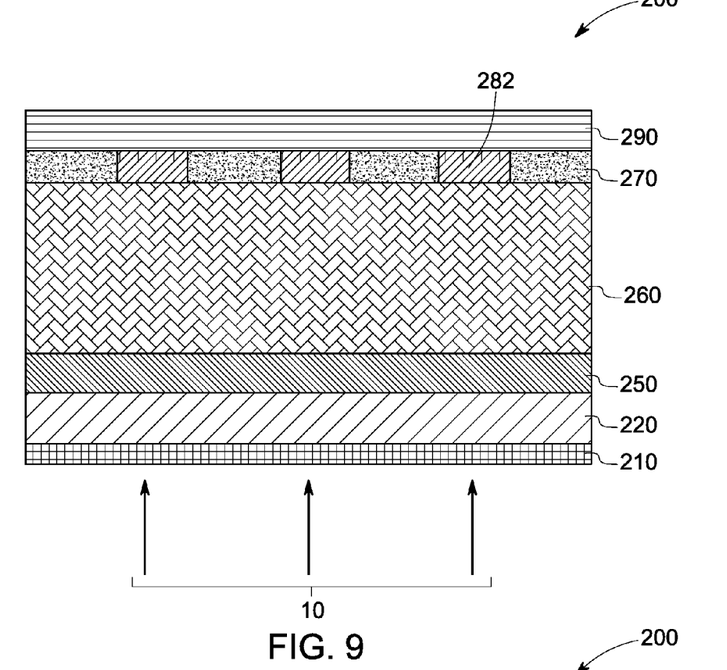
FIG. 9 is a schematic of a photovoltaic device, according to one embodiment of the invention.

In an alternate embodiment, the photovoltaic device 200 includes a second porous layer 270 disposed on the second semiconductor layer 260, wherein the second porous layer includes a plurality of pores 272 extending through a thickness of the second porous layer 270, as illustrated in FIG. 9. A p+-type semiconductor material is disposed in the plurality of pores 272 of the second porous layer 270 to form a patterned p+-type semiconductor layer 282. A metal layer 290 is disposed on the second porous layer 270 and the patterned p+-type semiconductor layer 282, as illustrated in FIG. 9. In such embodiments, the second porous layer 270, the patterned p+-type semiconductor layer 282, and the metal layer 290 may provide for an improved back interface or back contact in the photovoltaic device 200.

Figure 11:
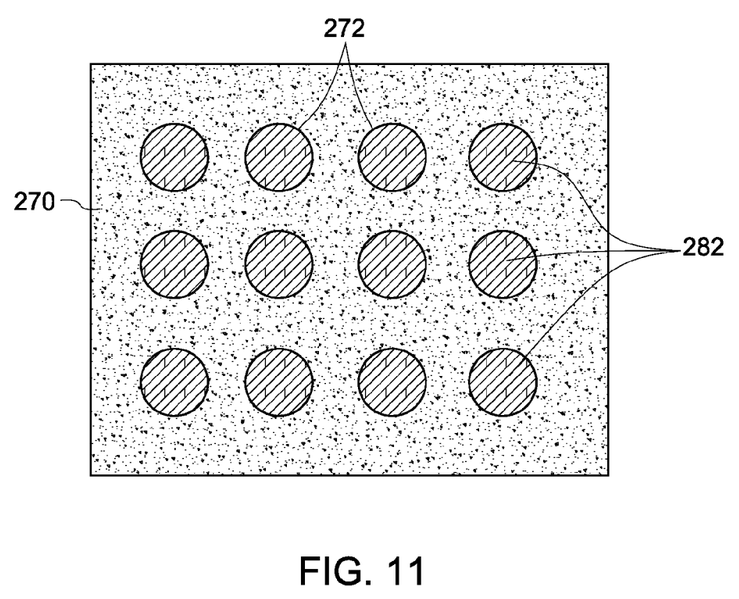
FIG. 11 is a schematic of a photovoltaic device, according to one embodiment of the invention.

The term "patterned p+-type semiconductor layer" as used herein refers to a plurality of discontinuous regions 282 of p+-type semiconductor material disposed within the plurality of pores of the second porous layer 270, as indicated in FIG. 11. In FIG. 11, the plurality of discontinuous regions 282 are indicated as circular in shape and of uniform shape and size. However, in some other embodiments, the patterned p+-type semiconductor layer 282 may include a plurality of discontinuous regions, wherein the regions may be of different shape or size. Thus, by way of example, in some embodiments, the patterned p+-type semiconductor layer 282 may include a plurality of patterned regions such that a cross-sectional area of the plurality of regions may vary from region to region. In some other embodiments, the patterned p+-type semiconductor layer 282 may include a plurality of patterned regions having a substantially same cross-sectional area. In one embodiment, the patterned p+-type semiconductor layer 282 may include a plurality of discontinuous regions having a circular shape, as illustrated in FIG. 11. The shape of the regions is not limited, however, and the regions may include any suitable shape. For example, regions 282 may have an oval shape or a square shape with rounded corners, or another more complex shape. In one embodiment, the shape and average size of the regions in the patterned p+-type semiconductor layer may be determined by the shape and size of the plurality of pores in the second porous layer, the deposition method, or both.

In one embodiment, the p+-type semiconductor material is disposed in the plurality of pores such that the p+-type semiconductor material is in contact with the second semiconductor layer 260. In one embodiment, the p+-type semiconductor material fills the pores 272 of the second porous layer 270. In one embodiment, a thickness of the patterned p+-type semiconductor layer 282 may be advantageously controlled such that the p+-type semiconductor material is only disposed inside the plurality of pores 272. In one embodiment, the p+-type semiconductor material is disposed in the plurality of pores 272 to form a patterned p+-type semiconductor layer 282 having a thickness lower than or substantially the same as the thickness of the second porous layer 270.

As noted earlier, in some embodiments, the discontinuous regions 282 in the patterned p+-type semiconductor layer 282 may function as point contact for charge collection. In one embodiment, in contrast to a continuous layer of p+-type semiconductor material in contact with the second semiconductor layer 260, a discontinuous patterned p+-type semiconductor layer 282 may be advantageously used to minimize interface recombination at the back interface, in accordance with one embodiment of the invention. Without being bound by any theory, it is believed that a total area over which a leakage current happens at the interface may be reduced as the contact area between the layers decreases, as indicated in FIG. 9. Lower interface recombination and reduced contact area may lead to lower leakage current density over the whole area. A lower leakage current density may advantageously lead to an increase in open circuit voltage (VOC) of the photovoltaic device 200.

Further, in some embodiments, the use of the second porous layer 240 and the patterned p+-type semiconductor 282 advantageously provides for an improved interface between the CdTe layer 260 and the back-contact layer 290, providing a low recombining back interface for photovoltaic devices employing thin CdTe layers, such as, for example having a thickness in a range less than about 2 microns.

In one embodiment, a patterned p+-type semiconductor layer 282 may be compositionally graded across the thickness of patterned p+-type semiconductor layer 282. The term "compositionally graded", as used herein, means that the composition of the patterned first semiconductor layer may vary from the first surface (in contact with the second semiconductor layer) to the second surface (in contact with the metal layer). In one embodiment, the material composition of the patterned p+-type semiconductor layer 282 may vary continuously across the thickness of the patterned p+-type semiconductor layer 282.

Figure 10:
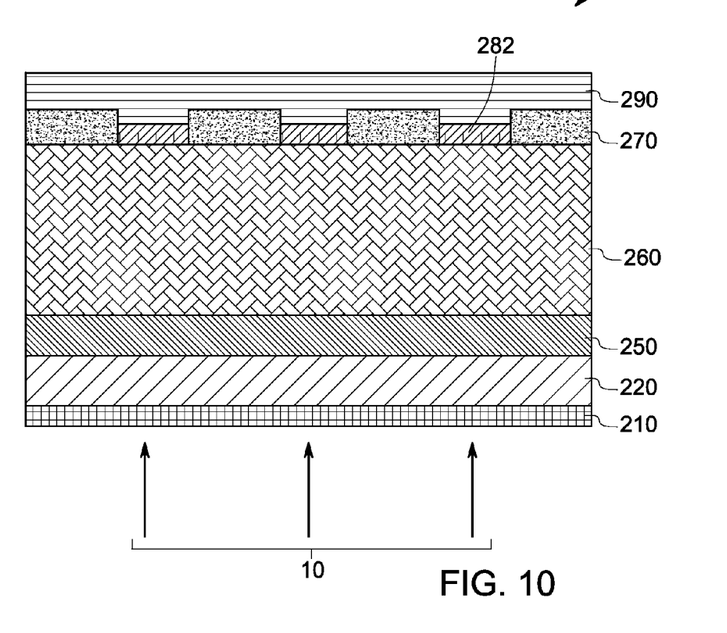
FIG. 10 is a schematic of a photovoltaic device, according to one embodiment of the invention.

In some other embodiments, a portion of the metal layer may be further disposed in the plurality of pores 272 in the second porous layer 270 to form a contact with the patterned p+-type semiconductor layer 282, as indicated in FIG. 10. In such embodiments, a patterned p+-type semiconductor material and a metal may together fill the pores of the second porous layer. In one embodiment, a patterned p+-type semiconductor layer 282 may be disposed in the plurality of pores of the second porous layer to a predetermined thickness and subsequently the metal may be disposed on top of the patterned p+-type semiconductor layer 282. In certain embodiments, the composition of the p+-type semiconductor material and the metal may vary continuously at the interface for the configuration shown in FIG. 10.

In one embodiment, the second porous layer 270 includes an insulating material. In one embodiment, the second porous layer 270 includes a material having passivation properties for the second semiconductor material, that is, a material that does not allow for electron-hole recombination at the interface between the second porous layer and the second semiconductor layer. In one embodiment, the second porous layer 270 includes a material having passivation properties for cadmium telluride. In one embodiment, the second porous layer 270 includes a material selected from the group consisting of silicon oxide, titanium oxide, silicon nitride, and combinations thereof.

Without being bound by any theory, it is believed that the distance between the pores and the size of the pores may be optimized for charge collection, which may depend on local field strength, current crowding, and diffusion length of charge carriers in CdTe. In one embodiment, the plurality of pores 272 in the second porous layer 270 have an average diameter in a range less than about 1000 nanometers. In another embodiment, the plurality of pores 272 in the second porous layer 270 have an average diameter in a range less than about 500 nanometers. In yet another embodiment, the plurality of pores 272 in the second porous layer 270 have an average diameter in a range less than about 100 nanometers. In a particular embodiment, the plurality of pores 272 in the second porous layer 270 have an average diameter in a range from about 100 nanometers to about 1000 nanometers.

In one embodiment, the average distance between the pores 272 in the second porous layer 270 is in a range less than about 1000 nanometers. In another embodiment, the average distance between the pores is in a range less than about 500 nanometers. In yet another embodiment, the average distance between the pores is in a range less than about 100 nanometers. In a particular embodiment, the average distance between the pores is in a range from about 100 nanometers to about 1000 nanometers.

The thickness of the second porous layer 270 may be determined by the desired depth of the plurality of pores 272 and also the desired thickness of the back contact. In one embodiment, the second porous layer 270 has a thickness in a range from about 10 nanometers to about 200 nanometers. In another embodiment, the second porous layer 270 has a thickness in a range from about 20 nanometers to about 150 nanometers.

In one embodiment, the plurality of pores 272 have a circular shape with vertical sidewalls, as illustrated in FIG. 6. The shape of pores 272 is not limited, however, and the pores may include any suitable shape. For example, pores 272 may have an oval shape or a square shape with rounded corners, or another more complex shape. In another embodiment, pores 272 may have tapered sidewalls.

The support 210, the transparent layer 220, the patterned first semiconductor layer 250, and the second semiconductor layer 260 may include materials and configurations as described herein earlier. The p+-type semiconductor layer 280, the patterned p+-type semiconductor layer 282, and the metal layer 290 may include materials as described herein earlier.

Figure 12:
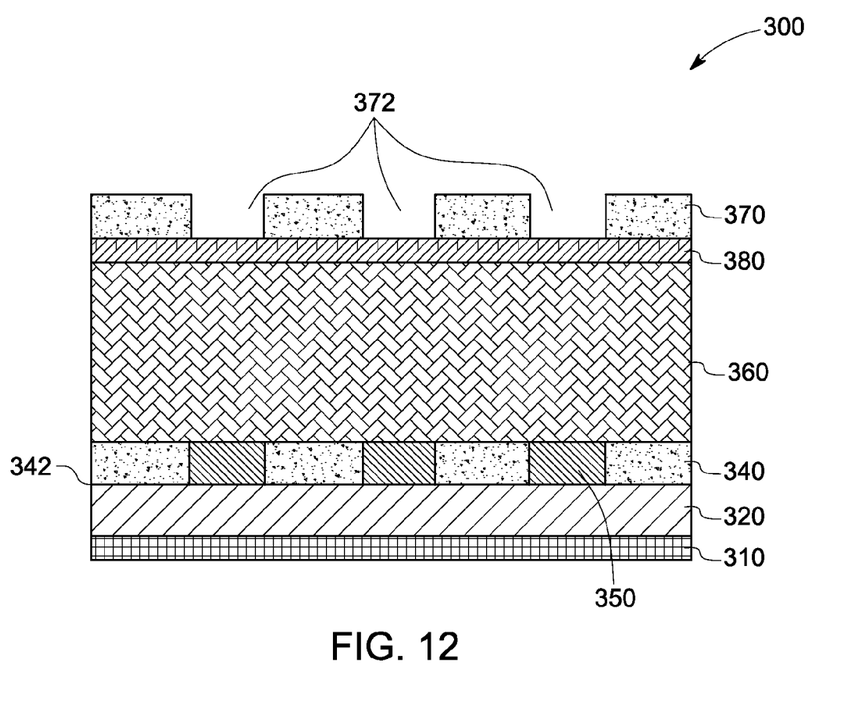
FIG. 12 is a schematic of a photovoltaic device, according to one embodiment of the invention.

In one embodiment, a photovoltaic device having improved front and back interfaces is provided. A photovoltaic device 300, according to one embodiment of the invention, is illustrated in FIGS. 12-16. As shown in FIGS. 12-16, the photovoltaic device 300 includes a transparent layer 320 and a first porous layer 340 disposed on the transparent layer 320. In one embodiment, the transparent layer 320 is disposed on a support 310. Further, as indicated in FIG. 12, the first porous layer 340 includes a plurality of pores 342 extending through a thickness of the first porous layer 340. In one embodiment, as indicated in FIG. 12, a first semiconductor material is disposed in the plurality of pores 342 to form a patterned first semiconductor layer 350. In one embodiment, the photovoltaic device 300 further includes a second semiconductor layer 360 disposed on the first porous layer 340 and the patterned first semiconductor layer 350, as indicated in FIG. 12. As noted earlier, the first porous layer 340, the patterned first semiconductor layer 350, and the second semiconductor layer 360 may provide for an improved front interface.

Further, in one embodiment, a p+-type semiconductor layer 380 is disposed on a second semiconductor layer 360 and a second porous layer 370 is disposed on the p+-type semiconductor layer 380. The second porous layer includes a plurality of pores 372 extending through a thickness of the second porous layer 370, as indicated in FIG. 12.

Figure 13:
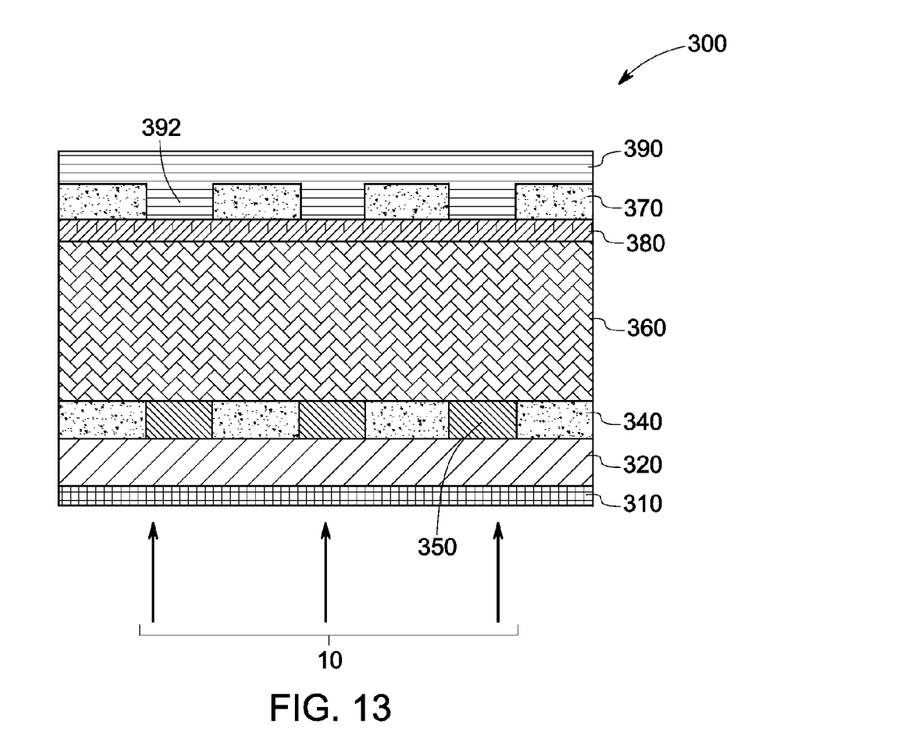
FIG. 13 is a schematic of a photovoltaic device, according to one embodiment of the invention.

Further, in one embodiment, a metal layer 390 is disposed on the second porous layer 370, wherein a portion of the metal layer 392 extends through the plurality of pores 372 in the second porous layer 370 to contact the p+-type semiconductor layer 380, as illustrated in FIG. 13. In such embodiments, the second porous layer 370, the p+-type semiconductor layer 380, and the metal layer 390 may provide for an improved back interface in the photovoltaic device 300.

Figure 14:
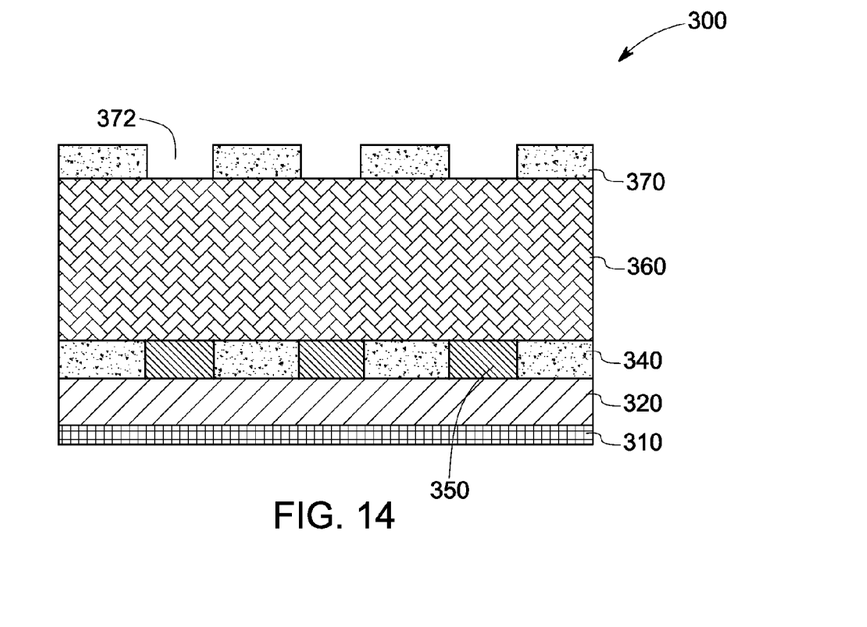
FIG. 14 is a schematic of a photovoltaic device, according to one embodiment of the invention.
Figure 15:
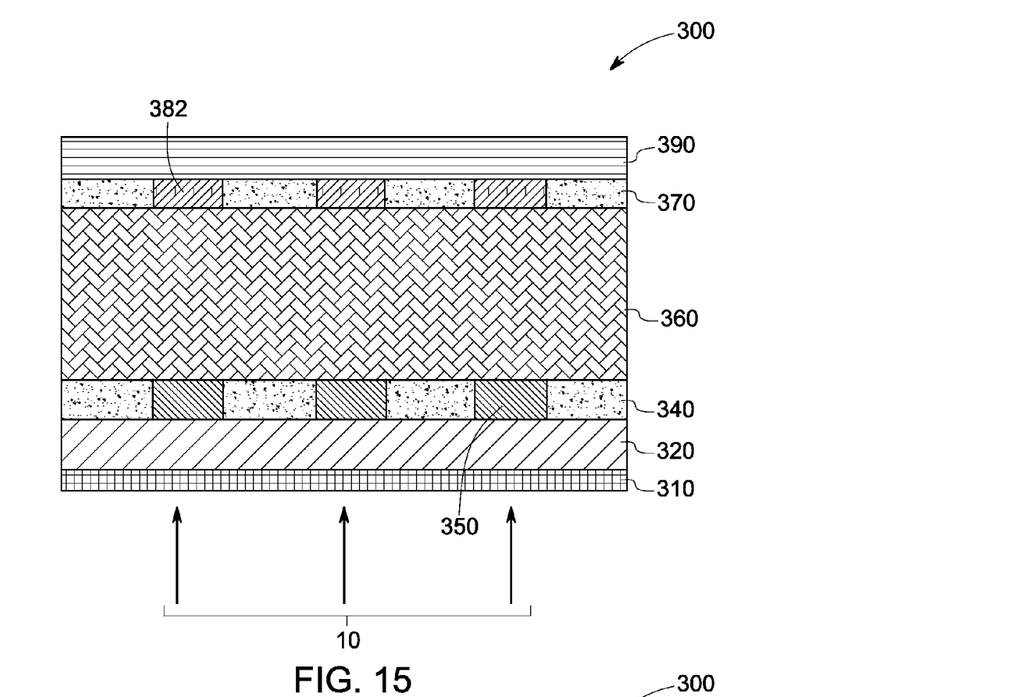
FIG. 15 is a schematic of a photovoltaic device, according to one embodiment of the invention.

In an alternate embodiment, the photovoltaic device 300 includes a second porous layer 370 disposed on the second semiconductor layer 360, wherein the second porous layer includes a plurality of pores 372 extending through a thickness of the second porous layer 370, as illustrated in FIG. 14. Further, a p+-type semiconductor material is disposed in the plurality of pores 372 of the second porous layer 370 to form a patterned p+-type semiconductor layer 382, as indicated in FIG. 15. A metal layer 390 is further disposed on the second porous layer 370 and the patterned p+-type semiconductor layer 382, as illustrated in FIG. 15. In such embodiments, the second porous layer 370, the patterned p+-type semiconductor layer 382, and the metal layer 390 may provide for an improved back interface or back contact in the photovoltaic device 300.

Figure 16:
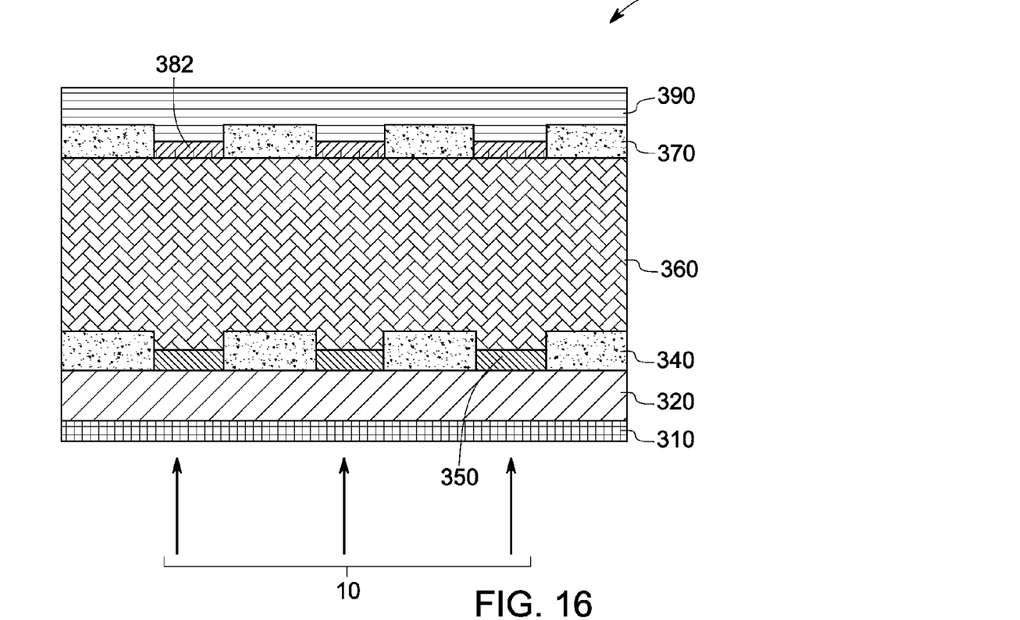
FIG. 16 is a schematic of a photovoltaic device, according to one embodiment of the invention.

In one embodiment, a patterned first semiconductor layer 350 may be compositionally graded across the thickness of patterned first semiconductor layer 350. In some other embodiments, a portion of the second semiconductor layer 360 may be further disposed in the plurality of pores 342 in the second porous layer 340 to form a contact with the patterned first semiconductor layer 350, as indicated in FIG. 16.

In another embodiment, a patterned p+-type semiconductor layer 382 may be compositionally graded across the thickness of patterned p+-type semiconductor layer 382. In some other embodiments, a portion of the metal layer 390 may be further disposed in the plurality of pores 372 in the second porous layer 370 to form a contact with the patterned p+-type semiconductor layer 382, as indicated in FIG. 16.

The support 310, the transparent layer 320, the first porous layer 340, the patterned first semiconductor layer 350, and the second semiconductor layer 360 may include materials and configurations as described herein earlier. The p+-type semiconductor layer 360, the second porous layer 370, the patterned p+-type semiconductor layer 382, and the metal layer 390 may include materials as described herein earlier.

In one particular embodiment, a photovoltaic device having a configuration as indicated in FIG. 15 is provided. With reference to FIG. 15, the photovoltaic device 300, includes a transparent layer 320 and a first porous layer 340 disposed on the transparent layer 320, wherein the first porous layer 340 includes a plurality of pores 342 extending through a thickness of the first porous layer 340. A first semiconductor material is disposed in the plurality of pores 342 in the first porous layer 340 to form a substantially transparent, patterned first semiconductor layer 350. A second semiconductor layer 360 is disposed on the first porous layer 340 and the patterned first semiconductor layer 350. The photovoltaic device 300, further includes a second porous layer 370 disposed on second semiconductor layer 360, wherein the second porous layer 360 includes a plurality of pores 372 extending through a thickness of the second porous layer 370. A p+-type semiconductor material is disposed in the plurality of pores 372 of the second porous layer 370 to form a patterned p+-type semiconductor layer 382, and a metal layer 390 is disposed on the second porous layer 370 and the patterned p+-type semiconductor layer 382.

In some embodiments, a method of making a photovoltaic device with an improved front interface is provided. Referring to FIG. 3, in some embodiments, the method includes disposing an electrically conductive layer 132 on a support 110 to form the transparent layer 120 by any suitable technique, such as sputtering, chemical vapor deposition, spin coating, spray coating, or dip coating. Referring to FIG. 3, in some embodiments, an optional buffer layer 134 may be deposited on the electrically conductive layer 132 using for example sputtering to form the transparent layer 120.

Referring to FIG. 3, a first porous layer 140 is further disposed on the transparent layer 120. In some embodiments, where a buffer layer 134 is used, the first porous layer 140 is disposed on the buffer layer 134. In some other embodiments, the first porous layer 140 is disposed directly on the electrically conductive layer 132. In one embodiment, the first porous layer 140 is disposed on the transparent layer 120 by depositing a layer of a suitable insulating suitable at desired thickness by any suitable technique, such as sputtering, chemical vapor deposition, spin coating, spray coating, or dip coating. Referring to FIG. 1, in some embodiments, the plurality of pores 142 are formed in the deposited layer by a masking and etching method to form the first porous layer 140. In such embodiments, the plurality of pores 142 may be formed by one or more of chemical etching, plasma etching, or lithography.

Referring again to FIG. 3, the method further includes disposing a first semiconductor material in the plurality of pores to form a patterned first semiconductor layer 150 (window layer). The first semiconductor material (for example, CdS) is selectively deposited in the pores such that CdS is in contact with the transparent layer 120 and only deposited inside the pores and not outside the pores 142. In one embodiment, CdS may be deposited, for example, by sputtering and a lift-off process may remove the CdS deposited outside the pores of the first porous layer 140. In an alternate embodiment, CdS may be preferentially deposited inside the pores using, for example, electrochemical deposition.

In some embodiments, the method further includes disposing a second semiconductor layer (absorber layer) 160 on the first porous layer 140 and the patterned first semiconductor layer 150. In one embodiment, the second semiconductor layer 160 may be deposited by employing one or more methods selected from close-space sublimation (CSS), vapor transport method (VTM), ion-assisted physical vapor deposition (IAPVD), radio frequency or pulsed magnetron sputtering (RFS or PM), plasma enhanced chemical vapor deposition (PECVD), (MOCVD), and electrochemical deposition (ECD).

In one embodiment, when the second semiconductor layer 160 is a p-type cadmium telluride layer, the second semiconductor layer 160 may be treated with cadmium chloride. In one embodiment, second semiconductor layer 160 may be treated with a solution of $CdCl_2$ salt. In another embodiment, second semiconductor layer 160 may be treated with $CdCl_2$ vapor. The treatment with $CdCl_2$ is known to increase the carrier density of the second semiconductor layer 160. The treatment with cadmium chloride may be followed by an etching or rinsing step. In one embodiment, etching may be carried out using a suitable acid. In other embodiments, the $CdCl_2$ may be rinsed off the surface, resulting in a stoichiometric cadmium telluride at the interface, mainly removing the cadmium oxide and $CdCl_2$ residue from the surface, leaving a cadmium-to-tellurium ratio of about 1 at the surface. The etching works by removing non-stoichiometric material that forms at the surface during processing. Other etching techniques known in the art that may result in a stoichiometric cadmium telluride at the back interface may also be employed.

Referring to FIG. 3, a p+-type semiconducting layer 180 may be further disposed on the second semiconductor layer 160 by depositing a p+-type material using any suitable technique, for example PECVD, in one embodiment. In an alternate embodiment, a p+-type semiconductor layer 180 may be disposed on the second semiconductor layer 160 by chemically treating the second semiconductor layer 160 to increase the carrier density on the back-side (side in contact with the metal layer and opposite to the first semiconductor layer) of the second semiconductor layer 160. In one embodiment, the photovoltaic device 100 may be completed by depositing a back contact layer, for example, a metal layer 190 on the p+-type semiconductor layer.

In some embodiments, a method of making a photovoltaic device 200 with an improved back interface is provided. Referring to FIG. 6, the method includes disposing a transparent layer 220 on a support 210 using a suitable technique as described earlier. The method further includes disposing a first semiconductor layer 250 on the transparent layer 220. Non-limiting examples of the deposition methods for the first semiconductor layer 250 include one or more of close-space sublimation (CSS), vapor transport method (VTM), sputtering, electrochemical bath deposition (ECD), or chemical bath deposition (CBD). The method further includes disposing a second semiconductor layer 260 on the first semiconductor layer 250 using a suitable technique as described earlier. The method further includes disposing a second porous layer 270 on the second semiconductor layer 260 and disposing a metal layer 290 on the second porous layer 270.

Referring to FIG. 8, in one embodiment, the method further includes disposing a p+-type semiconductor layer 280 on the second semiconductor layer before disposing the second porous layer 270. A p+-type semiconducting layer 280 may be disposed on the second semiconductor layer 260 by depositing a p+-type material using any suitable technique, for example PECVD, in one embodiment. In an alternate embodiment, a p+-type semiconductor layer 280 may be disposed on the second semiconductor layer 260 by chemically treating the second semiconductor layer 260 to increase the carrier density on the back-side (side in contact with the metal layer and opposite to the first semiconductor layer) of the second semiconductor layer 160 before disposing the second porous layer 270.

In one embodiment the second porous layer 270 is disposed on the second semiconductor layer 260 or the p+type semiconducting layer 280 by depositing a layer of a suitable insulating material at desired thickness by any suitable technique, such as sputtering, chemical vapor deposition, spin coating, spray coating, or dip coating. Referring to FIG. 6, in some embodiments, a plurality of pores 272 may be formed in the deposited layer by a masking and etching method to form the second porous layer 270. In such embodiments, the plurality of pores 272 may be formed by one or more of chemical etching, plasma etching, or lithography.

In one embodiment, the photovoltaic device may be completed by depositing a back contact layer, for example a metal layer 290 on the second porous layer 270. Referring to FIG. 7, in some embodiments, the metal layer is deposited in such a way that a portion of the metal layer 292 extends through the plurality of pores 272 in the second porous layer 270 to contact the second semiconductor layer 260. Referring to FIG. 8, in some other embodiments, the metal layer is deposited in such a way that a portion of the metal layer 292 extends through the plurality of pores 272 in the second porous layer 270 to contact the p+-type semiconductor layer 280.

In an alternate embodiment, the method includes disposing a p+-type semiconductor material in the plurality of pores 272 in the second porous layer 270 to form a patterned p+-type semiconductor layer 282, as indicated in FIG. 9. The p+-type semiconducting material is selectively deposited in the pores such that the p+-type semiconducting material is in contact with the second semiconductor layer 260 and only deposited inside the pores and not outside the pores 272. In one embodiment, the p+-type semiconductor material is disposed in the plurality of pores 272, for example, by selectively chemically treating the second semiconductor layer 260 through the second porous layer 270 to increase the carrier density in selected regions of the second semiconductor layer 260. In one embodiment, the photovoltaic device 200 may be completed by depositing a back contact layer, for example a metal layer 290 on the second porous layer 270 and the patterned p+-type semiconductor layer 282, as indicated in FIG. 9.

In some embodiments, a method of making a photovoltaic device 300 with improved front and back interfaces is provided. Referring to FIG. 12, the method includes, in some embodiments, disposing a transparent layer 320 on a support 310. Referring to FIG. 12, the method includes disposing a first porous layer 340 on the transparent layer 320. In some embodiments, where a buffer layer is used, the first porous layer 340 is disposed on the buffer layer (not shown). In some other embodiments, the first porous layer 340 is disposed directly on the electrically conductive layer (not shown). The method further includes disposing a first semiconductor material in the plurality of pores in the first porous layer 340 to form a patterned first semiconductor layer 350. In some embodiments, the method further includes disposing a second semiconductor layer (absorber layer) 360 on the first porous layer 340 and the patterned first semiconductor layer 350.

Referring to FIG. 13, the method further includes, in one embodiment, disposing a p+-type semiconductor layer 380 on the second semiconductor layer 360 and disposing a second porous layer 370 on the p+-type semiconductor layer 380. The method further includes disposing a metal layer 390 on the second porous layer 370, such that a portion of the metal layer 392 extends through the plurality of pores in the second porous layer 370 to contact the p+-type semiconductor layer 380 to complete the photovoltaic device 300.

Referring to FIGS. 14 and 15, the method includes, in an alternate embodiment, disposing a second porous layer 370 on the second semiconductor layer 360 and disposing a p+-type semiconductor material in the plurality of pores 372 in the second porous layer 370 to form a patterned p+-type semiconductor layer 382. The method further includes disposing a metal layer 390 on the second porous layer 370 and the patterned p+-type semiconductor layer 382 to complete the photovoltaic device 300. The transparent layer 320, the first porous layer 340, the patterned first semiconductor layer 350, the second semiconductor layer 360, the p+-type semiconductor layer 380, the patterned p+-type semiconductor layer 382, the second porous layer 370, and the metal layer 390 may be deposited using a suitable technique described earlier.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A photovoltaic device, comprising:
a transparent layer;
a first porous layer disposed on the transparent layer, wherein the first porous layer comprises a plurality of pores extending through a thickness of the first porous layer, wherein the first porous layer comprises a material selected from the group consisting of silicon oxide, titanium oxide, silicon nitride, and combinations thereof;

a first semiconductor material disposed in the plurality of pores to form a patterned first semiconductor layer, wherein the first semiconductor material comprises cadmium sulfide; and a second semiconductor layer disposed on the first porous layer and the patterned first semiconductor layer, wherein the second semiconductor layer comprises cadmium telluride, wherein the patterned first semiconductor layer is substantially transparent.

2. The photovoltaic device of claim 1, wherein a thickness of the patterned first semiconductor layer is lower than or substantially the same as the thickness of the first porous layer.

3. The photovoltaic device of claim 1, wherein an average diameter of the plurality of pores is greater than a thickness of the patterned first semiconductor layer.

4. The photovoltaic device of claim 1, wherein the first porous layer has a first surface in contact with a second surface of the second semiconductor layer, and the first porous layer has a second surface in contact with a first surface of the transparent layer.

5. The photovoltaic device of claim 1, wherein the plurality of pores have an average diameter in a range less than about 1000 nanometers.

6. The photovoltaic device of claim 1, wherein the first porous layer has a thickness in a range from about 50 nanometers to about 100 nanometers.

7. The photovoltaic device of claim 1, wherein the patterned first semiconductor layer is compositionally graded across a thickness of the patterned first semiconductor layer.

8. The photovoltaic device of claim 1, further comprising a second semiconductor material disposed in the plurality of pores, wherein the first semiconductor material and the second semiconductor material form a compositionally graded layer.

9. The photovoltaic device of claim 1, further comprising a metal layer disposed on the second semiconductor layer.

10. The photovoltaic device of claim 9, further comprising a p+-type semiconductor layer interposed between the metal layer and the second semiconductor layer.

* * * * *